(12) United States Patent
Heeb

(10) Patent No.: US 7,259,700 B2
(45) Date of Patent: Aug. 21, 2007

(54) METHOD AND DEVICE FOR CONVERTING THE SAMPLING FREQUENCY OF A DIGITAL SIGNAL

(75) Inventor: Thierry Heeb, Fey (CH)

(73) Assignee: Anagram Technologies, SA, Preverenges (CH)

( * ) Notice: Subject to any disclaimer, the term of this patent is extended or adjusted under 35 U.S.C. 154(b) by 0 days.

(21) Appl. No.: 11/439,108

(22) Filed: May 23, 2006

(65) Prior Publication Data

US 2006/0277238 A1 Dec. 7, 2006

(30) Foreign Application Priority Data

May 23, 2005 (FR) .................................. 05 05164

(51) Int. Cl.
*H03M 7/00* (2006.01)
(52) U.S. Cl. ......................................... 341/61; 708/313
(58) Field of Classification Search .................. 341/61; 708/313
See application file for complete search history.

(56) References Cited

U.S. PATENT DOCUMENTS

| | | | |
|---|---|---|---|
| 5,835,032 A | | 11/1998 | Yasuda et al. |
| 5,903,482 A | * | 5/1999 | Iwamura et al. ............. 708/313 |
| 5,907,295 A | * | 5/1999 | Lin .............................. 341/61 |
| 6,141,671 A | * | 10/2000 | Adams et al. ............... 708/313 |
| 6,208,671 B1 | * | 3/2001 | Paulos et al. ................ 370/545 |
| 6,747,858 B1 | * | 6/2004 | Sculley et al. ................ 361/61 |
| 6,870,492 B1 | | 3/2005 | Jensen |
| 7,102,547 B2 | * | 9/2006 | Jensen ......................... 341/61 |
| 7,126,503 B2 | * | 10/2006 | Pasquier et al. .............. 341/61 |
| 7,129,868 B2 | * | 10/2006 | Ku ............................... 341/61 |
| 2003/0102991 A1 | * | 6/2003 | Pasquier ...................... 341/61 |

OTHER PUBLICATIONS

Gockler, H. G., et al., "Minimal block processing approach to fractional sample rate conversion", Signal Processing, Amsterdam, NL, vol. 81, No. 4, (Apr. 2001), pp. 673-691.

* cited by examiner

*Primary Examiner*—Khai M. Nguyen
(74) *Attorney, Agent, or Firm*—Fulbright & Jaworski LLP

(57) ABSTRACT

The invention relates to a method of converting sampling conversion with a predetermined ratio between an input frequency (Fsin) and an output frequency (Fsout). It comprises an initialization phase (40-44) of selective configuration, according to the conversion ratio, of an under-sampling filter and a band-pass filter, and a real time phase comprising the stages of selective over-sampling (45), over-sampling by a factor of two and selective band-pass filtering (46), over-sampling by a factor of sixty four (47) and polynomial interpolation of the quadratic "B-Spline" type (48).

The invention also relates to a device (4) for implementation of the method.

11 Claims, 6 Drawing Sheets

METHOD AND DEVICE FOR CONVERTING THE SAMPLING FREQUENCY OF A DIGITAL SIGNAL

The invention relates to a method for converting the sampling frequency of a digital signal.

The invention also relates to a device for carrying out the method.

It may be applied more particularly, but not exclusively, in the field of digital audio signal processing.

To basic concepts of the invention will be examined in the following on the basis of this preferred embodiment of the invention.

Generally speaking, many modern signal processing processes are implemented in the digital field. The sampling frequencies used vary according to the required signal quality and the available bandwidth of the data transmission channel. For example, the audio processing systems typically use sampling frequencies of 48, 96 or 192 kHz for a professional audio quality, a sampling frequency of 44.1 kHz for a so-called "general public" quality as far as CD audio quality is concerned, and sampling frequencies of 8 kilohertz to 192 kHz for the compression/decompression audio standards processing audio signals.

To simplify the description, the Sampling Rate Converter that carries out this process will hereafter be referred to as "SRC", according to the English terminology currently used).

The use of an "SRC" that carries out a sampling frequency conversion is unavoidable in interface devices arranged between two systems operating at different sampling frequencies.

FIG. 1 attached to this description illustrates very diagrammatically such an "SRC", denoted by 1. Input signal Vi is sampled at the frequency Fsin, and output signal Vo is sampled at the frequency Fsout.

In the description that follows the designation Fs refers to a generic sampling frequency, whilst Fsin and Fsout refer explicitly to the input and output frequencies respectively.

The task of an asynchronous sampling rate converter, or "SRC", is essentially to calculate output data sampled at an output sampling frequency Fsout as a function of input data sampled at an input sampling frequency and of a Fsin/Fsout conversion ratio, all these parameters being predetermined. In other words, the sampling frequency conversion is carried out by interpolating the input data for generating output data at the output sampling frequency. The "SRC" is of the asynchronous type if the Fsin/Fsout ratio cannot be described as a ratio of two positive whole numbers. Henceforth in this description the term "SRC" will be used to specify whether the converter is a sampling rate converter of the asynchronous type.

The "SRC's" are often characterised by their performances in terms of so-called "THD+N" (according to the English abbreviation currently used for "Total Harmonic Distortion+Noise") and of "SNR" (according to the English abbreviation currently used for "Signal to Noise ratio"), as well as by the maximum and minimum possible Fsout/Fsin ratios. The limitations associated with these parameters are linked to the algorithm used to obtain the sampling frequency conversion.

Numerous solutions have been proposed in the Prior Art. By way of non-exhaustive examples mention may be made of the following typical "SRC's" on the market:

the integrated circuits that use an "SRC", models SRC4190, SRC4192 and SRC4193, sold by TEXAS INSTRUMENTS, Inc. (registered trademark), based on the technology described in the U.S. Pat. No. 6,747,858 B1 (Terry L. Sculley et al.);

the integrated circuits that use an "SRC", models AD1896 and AD1895, sold by ANALOG DEVICES, Inc. (registered trademark), based on the technology described in the U.S. Pat. No. 6,141,671 B1 (Robert W. Adams et al); or the integrated circuits that use an "SRC", models CS8420 and CS8421), sold by CIRRUS LOGIC, Inc. (registered trademark), based on the technology described in the U.S. Pat. No. 6,208,671 B1 (John Paulos et al.).

The patent of Terry L. Scully et al. (TEXAS INSTRUMENTS) is based on a retroaction loop to compensate for the errors inherent in the sampling frequency conversion process. This characteristic is similar to that used in a modulator of the so-called "delta-sigma" type. A decimation filter stage is used at the output of an interpolation stage. This approach involves operating at a greater speed than the output sampling frequency. Moreover, it is necessary to provide a storage memory of the "ROM" (Read Only Memory) type or similar of relatively large capacity, the number of coefficients of the filters used being typically between 500 and 1000.

According to the patent of Robert W. Adams et al. (ANALOG DEVICES), the sampling frequency conversion process is carried out adaptively by linearly interpolating filter coefficients to obtain the desired sampling frequency conversion. It is the entire filter (e.g. with many connections, typically 64 or more) that is interpolated before being applied to the signal. Again, this approach requires a large quantity of "ROM" memory, because in a preferred embodiment, including that used in the above-mentioned integrated circuits, the resultant number of filter coefficients is equal to 2048.

The patent of John Paulos et al. (CIRRUS LOGIC) discloses a sampling frequency conversion process based on over-sampling that depends on the Fsin/Fsout ratio, which a priori is a variable ratio. It is based on the spectral properties of the phantom images that appear at the frequencies associated with the over-sampling, for example in relation to the Fsin/Fsout ratio. Again, this approach requires a large quantity of "ROM" memory, because the number of filter coefficients is typically equal to 8000.

With regard to the possible Fsin/Fsout conversion ratios, it should be pointed out that the TEXAS INSTRUMENT approach typically limits them to 16:1 or 1:16, and the respective ANALOG DEVICES and CIRRUS LOGIC approaches both limit them to 7.75:1 and 1:8, according to whether Fsin is larger or smaller than Fsout.

It is therefore established, among other things, that none of the solutions of Prior Art is suitable, for example, for converting a stream of data at a frequency of 8 kHz, generated by a "GSM" standard mobile telephone, to an audio signal sampled at a frequency of 192 kHz.

It is therefore felt necessary to provide a sampling frequency conversion method that does not suffer from the disadvantages of the Prior Art, some of which have just been briefly outlined.

This is therefore the main object of the invention.

Moreover, a further object of the invention is to provide a method that meets additional requirements not covered by the Prior Art.

The method according to the invention allows sampling frequency conversion ratios, Fsin/Fsout, of almost unlimited amplitude. In fact, according to the invention, the limitation of this ratio is due exclusively to the limitations of calculating capacity of the device carrying out the method and not to the limitations inherent in the basic algorithm used, as is the case in the Prior Art.

Another important aspect of the method according to the invention is its capacity to use the sampling frequency conversion algorithm, on which it is based, to calculate the variable filter coefficients. In fact, when Fsout<Fsin, a band-pass limiting filter must be applied to avoid band fold-back, or "aliasing", according to the English terminology currently used. It is clear that the band-pass limitation filtering depends on the Fsin/Fsout ratio, and because of this the filter coefficients vary with this ratio. In the Prior Art some filter coefficients are modified (continuously and in real time) by using a special coefficient adaptation algorithm. The method according to the invention, as indicated above and as will be demonstrated below, uses the same algorithm for adapting the band-pass limitation filter and for executing the sampling frequency conversion.

Another important aspect of the method according to the invention is that it enables the "data interpolation" function to be separated from the "band-pass limitation" function when Fsout is less than Fsin. In the classic "SRC" architectures of Prior Art the sampling frequency conversion algorithm mixes three functions in the "real time" path of the algorithm. According to the method of the invention, the input filter coefficients are adapted to obtain a band-pass limitation, but this adaptation is not carried out in real time or in the real time path of the algorithm, which requires greatly reduced data processing resources, particularly calculating capacity. According to the method of the invention the only adaptive part in real time is therefore the interpolation proper. Moreover, the algorithm underlying the method of the invention, in a preferred embodiment, such as a filter with only three points applying a technology based on the mathematical curves of the type known under the name "B-Splines", and more precisely, in a preferred embodiment, quadratic "B-Spline" curves.

Yet another important characteristic of the sampling frequency conversion method according to the invention is that it requires only very few filter coefficients, which in turn requires reduced storage capacity: memory of the type "ROM" or similar. Typically, the required number of filter coefficients is equal to 600 maximum in a preferred embodiment, but it has been demonstrated, in a practical exemplary embodiment, that an "SRC" making use of the method of the invention could be implemented with a much lower number of filter coefficients, typically equal to 300, which is considered to be very significantly below the number of filter coefficients required in the methods of prior art, particularly the methods described in the above-mentioned American patents.

Finally, besides the main intended application of the method according to the invention, namely the sampling frequency conversion proper, the method may also be used to advantage in numerous other applications, in particular whenever the need is felt to synchronise the data sampling frequency with that of the signals generated by the general clock of a system.

By way of non-exhaustive example mention may be made of the systems that make use of the periods of prior art under the English abbreviation "DSS", standing for "Data to System synchronisation", in which digital data synchronisation systems are used as standard.

Summarising, the sampling frequency conversion method according to the invention presents the following advantages:

it is not very complex and has high performance;
it makes use of a data interpolation polynomial of the order of more than 1, with a short three-point adaptive filter;
it allows potentially unlimited conversion ratios of the input to output sampling frequencies;
it enables a separation to be made between the band-pass limitation and interpolation stages;
it makes use of the same algorithm to execute the sampling frequency conversion and to derive the band-pass limiting filter coefficients; and
it requires only low storage capacity, since the number of filter coefficients is low.

The principal object of the invention is therefore a sampling frequency conversion method according to a predetermined ratio comprising a first initialisation stage, consisting in acquiring a first sampling frequency, referred to as Fsin, associated with a first digital, so-called input signal, and in selecting a second sampling frequency, referred to as Fsout, associated with a second digital, so-called output signal, the ratio between the said first and second sampling frequencies constituting the said predetermined ratio, characterised in that it comprises an initialisation phase that includes:

a first initialisation stage consisting in determining a single whole number k, So that the relation:

$$(Fsin/Fsout)2^k > 1 \geq (Fsin/Fsout)/(2^{(k+1)})$$

is satisfied, and in recording the said number in storage means;

a second initialisation stage consisting if k>0, in configuring a digital filter for under-sampling the said input signal by a factor of $2^k$, and in recording the parameters associated with this configuration in storage means;

a third initialisation stage consisting in configuring a digital band-pass limiting filter with a cut-out frequency Fsout/2, in determining its coefficients if, and only if, one of the following relations is satisfied: Fsin>Fsout≧Fsin/2 or Fsin/2<Fsout, i.e. if k≧0, and in recording the said coefficients in storage means;

and a process phase executed in real time, comprising:

a first process stage consisting, if and only if k>0, in applying the said under-sampling filter by a factor $2^k$ to the said input signal in order to generate a first intermediate signal;

a second process stage consisting, if an only if k≧0, in applying the said digital band-pass limiting filter to the said first intermediate signal, and in short-circuiting this filter if k<0 in order to generate a second intermediate signal;

a third process stage consisting in over-sampling the said second intermediate signal by a predetermined factor L; and a fourth process stage consisting in applying to the said third intermediate signal a digital data interpolation stage in order to generate the said output signal at the sampling frequency Fsout.

A further object of the invention is a device for implementing the method.

The invention will now be described in greater detail with reference to the attached drawings, in which FIG. 1 illustrates diagrammatically an embodiment of a sampling frequency converter device of prior art;

Without limiting the scope of the invention in any way whatsoever, the preferred field of application of the invention will be exampled below, unless otherwise mentioned, i.e. the case of a sampling rate converter, or "SRC", intended for the processing of audio signals, will be described.

Before describing the method of the invention, and a device for implementing this method, it is appropriate to summarise some of the fundamental characteristics of the components and circuits constituting this device for implementing the method.

The technologies used are in themselves well known and common to the Prior Art, which is, incidentally, an added advantage of the method of the invention because it enables commercially available components to be used. The innovating characteristics of the invention relate to their specific arrangement enabling the objects established to be achieved.

In the figures that follow the common elements are provided with the same references and will not be described again unless this is necessary.

The low pass filters constitute a first component used in the device of the invention.

As its name implies, a low pass filter only allows frequencies below a predetermined value to pass through, and blocks the higher frequencies and at least considerably attenuates frequencies above the cut-off point.

Figure 1:
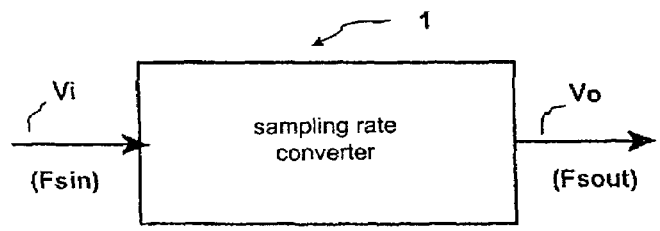
Figure 2:
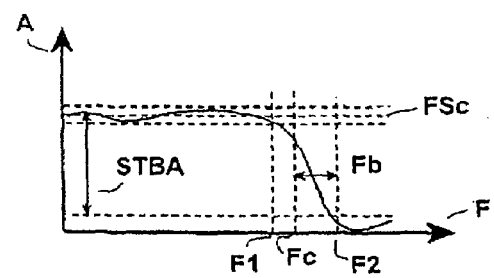
FIG. 2 illustrates the frequency response curve of a low pass filter.

Several parameters define a low pass filter, as illustrated by the graph in FIG. 2: the vertical axis represents amplitude A of the output signal, and the horizontal axis represents its frequency spectrum F.

Fc is the so-called cut-off frequency, which is normally defined as the frequency for which the output signal is attenuated by 3 dB relative to the input signal. However, the filters used in the "SRC's" are of the so-called "FIR" type (FIR stands for "Finite Impulse Response"), and this definition is used rather to characterise filters of the so-called "IIR" type (IIR stands for "Infinite Impulse Response").

Ideally the frequency response in the "band-pass" section (lower section of the spectrum between 0 and Fc) is flat. However, for many types of filters there is a residual ripple in this spectrum: comprised between the upper and lower limits (denoted by two dotted lines in FIG. 2), at various points with an ideal maximum amplitude FSc (median dotted line). The "band-pass" ripple is normally specified as being the maximum ripple amplitude and is expressed in dB.

Other important characteristic parameters are also shown in FIG. 2: the maximum frequency F1 of the band-pass (point of inflexion of the curve for an ideal filter), the lower band cut-off frequency (amplitude of the zero signal for a perfect filter), the rear fold-back (English terminology) Fb (range of frequencies between Fc and F1), and band cut-off attenuation.

In the device according to the invention the low pass filters are advantageously constructed on the basis of filters of the above-mentioned "FIR" type, more precisely linear phase filters, or at least quasi-linear phase filters.

Figure 3:
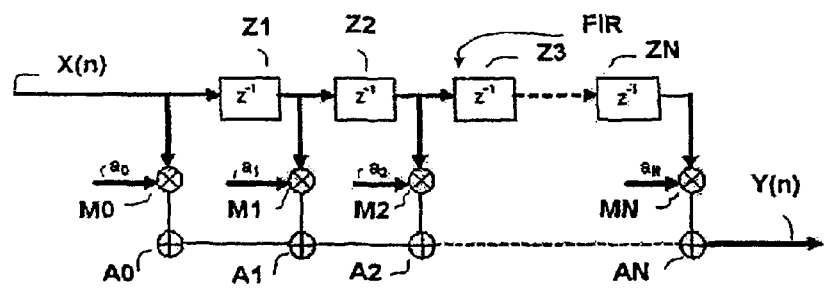
FIG. 3 illustrates diagrammatically a digital filter of the so-called "FIR" type.

FIG. 3 illustrates diagrammatically a filter of this type, denoted by FIR.

The instantaneous output signal y(n) of filter FIR at N+1 intermediate signal connection points and N cells, Z1 to ZN, consisting of operators of unit delay $Z^{-1}$, satisfies the relation below:

$$y(n)=a_0x(n)+a_1x(n-1)+a_2x(n-2)+\ldots a_Nx(n-N) \quad (1)$$

a relation in which x(n) is an input sample at time n, with a determined sampling frequency Fs.

The base blocks of this FIR filter consist of the above-mentioned unit delay operators Z1 to ZN, arranged in cascade (upper line), N+1 multipliers, M) to MN. At a first input the latter receive the signal x(n), for M0, and the signals at the output of the cells, Z1 to ZN, for M1 to MN and at a second input the parameters $a_0$ to $a_N$ in relation (1), constituting the coefficients of the FIR filter. The output signals of multipliers M0 to MN are transmitted to a second input of adders A0 to AN, the latter receiving at a first input (except the first adder A0) the output signal of the preceding adder. The output signal of the last adder is the output signal of the filter and is equal to y(n) (relation (1)).

A linear phase filter has a delay identical to all the frequencies, which guarantees minimal distortion of the characteristics in the time domain. As far as the "FIR" filters are concerned, this characteristic may easily be obtained by selecting real and symmetrical numbers for the coefficients $a_0$ to $a_N$.

Over-sampling is the operation that consists in increasing the sampling frequency of a given signal by a factor equal to a whole number, for example L. This may be achieved by:

inserting the L−1) zeroes between the successive input samples, or "zero-padding" according to the English terminology currently used; and by applying a low pass filter to the over-sampled signal thus obtained.

The "zero-padding" may be obtained as follows:

It is assumed that x(n) and y(n) are the original and over-sampled signals respectively in the "time domain":

$$y(n) = \begin{cases} x\left(\dfrac{n}{L}\right) & \text{for } n = 0, \pm L, \pm 2L, \pm 3L, \pm 4L \\ 0 & \text{otherwise} \end{cases}$$

The result of which, transposed into the "frequency range", is:

$$Y(f) = \sum_{n=-\infty}^{+\infty} u(n)e^{-j2\pi fn} \qquad (2)$$
$$= \sum_{n=-\infty}^{+\infty} x(n)e^{-j2\pi fLn}$$
$$= X(Lf)$$

The zero-padding creates a higher sampling frequency whose spectrum is identical to the spectrum of the original signal in the original bandwidth but presents phantom images, or "aliases", of the original spectrum, centred on multiples of the original sampling frequency.

In this context the purpose of a "FIR" low pass filter is to eliminate the folded back spectral signals caused by the zero-padding.

To avoid unnecessary calculations, when input samples are fixed to zeroes, L polyphase filters are used instead of zero-padding to obtain the "FIR" filtering. The polyphase filters are secondary filters derived from the original "FIR phase linear filter.

The polyphase decomposition of an "FIR" filter, which will be referred to as H(z) of length Ntotal (on which zero-padding is carried out so that the length is a multiple of L) is given by the relation below:

$$H(Z) = \sum_{i=0}^{L-1} Z^{-i} H_i(Z^L) \qquad (3)$$

a relation in which the impulse responses of $H_0(z), \ldots, H_{L-1}(z)$ are:

$h_0(n) = \{h(0), h(L), h(2L) \ldots\}$ $h_1(n) = \{h(1), h)L+1), h(2L+1) \ldots\}$ $h_{L-1}(n) = \{h(L-1), h(2L-1), h(3L-1) \ldots\}$ For each input L outputs are therefore calculated by making L basic "FIR" calculations, each using a different assembly of coefficients.

The number of connections of each polyphase filter is equal to Npolyphase=Ntotal/L.

The coefficients of each polyphase filter may be determined by retaining only every $L^{th}$ coefficient, starting with the coefficients 0 to L−2 in order to calculate the corresponding outputs 0 to L−1.

Figure 4:
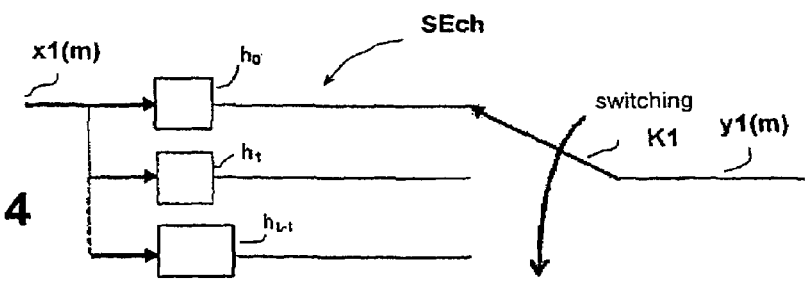
FIG. 4 illustrates diagrammatically a digital data over-sampler.

FIG. 4 illustrates diagrammatically an interpolator, reference SEch, implementing this process. The input signal, with a sampling frequency Fsin, denoted by x1(m), is transmitted to the inputs of L cells, denoted by $h_0$ to $h_{L-1}$. A changeover switch K1 scans the outputs of these cells. The output signal y1(m) represents the result of relation (3) above, with a sampling frequency LxFsin.

Under-sampling is the dual operation previously described. It consists in reducing the sampling frequency of a given signal by a factor equal to a whole number. Because the resultant sampling frequency is less than the input frequency, low pass filtering must of course be applied to eliminate the frequency components not required.

Practically speaking, reducing the sampling frequency by a factor M, a whole number, consists in:
applying to the signal a low pass filter; and
only retaining the $M^{th\ samples.}$ The purpose of low pass filtering, which will be referred to as Hm(f), is to limit the signal in band-pass to a sampling frequency Fsin/(2M) to meet the requirements of the sampling theorem. As a result, the entire signal content above the sampling half-frequency Fsout=Fsin/MN is lost. Within the frequency range the following relation is therefore obtained:

$$Hm(f) = \begin{cases} 1 \text{ for } 0 < f < F\sin/2M \\ 0 \text{ for } F\sin/2M < f < F\sin/2 \end{cases} \qquad (4)$$

To obtain a decimated signal (i.e. under-sampling), each output $M^{th}$ sample must be retained (the first phase, $\phi_0$, is selected arbitrarily), all the other samples are skipped.

Figure 5:
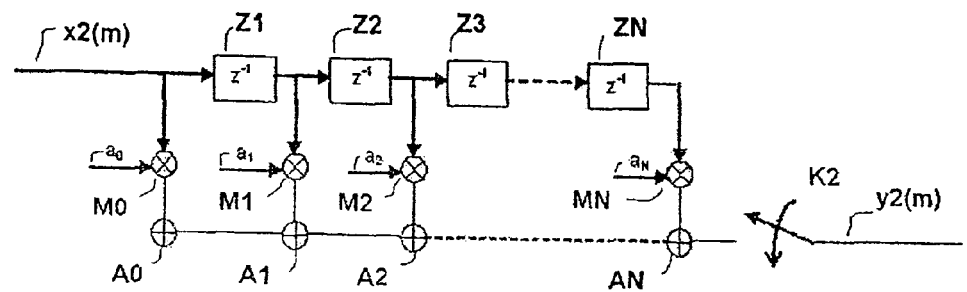
FIG. 5 illustrates diagrammatically a digital data decimator circuit.

FIG. 5 illustrates diagrammatically a decimator, denoted by DEC, that executes the operation described above. The input and output signals are arbitrarily referred to as x2(m) and y2(m) respectively. The configuration of the DEC circuit is similar to that of the circuit in FIG. 3: N elementary delay operators $Z^{-1}$, N+1 multipliers, M0 to MN, receiving at one of the two inputs the coefficients of the filter, $a_0$ to $a_N$, as previously, and N+1 adders, A0 to AN. The main difference consists in inserting a changeover switch, denoted by K2, between the output of the elementary circuits previously described and the output of the DEC decimator proper, in order to obtain the decimation according to relation (4). This changeover switch K2 scans in sequence M stages identical to that represented in FIG. 5.

The output signal y2(m) represents the result of relation (4) and its sampling frequency Fsout is equal to Fsin/M, Fsin being the sampling frequency of the input signal x2(m).

Figure 6:
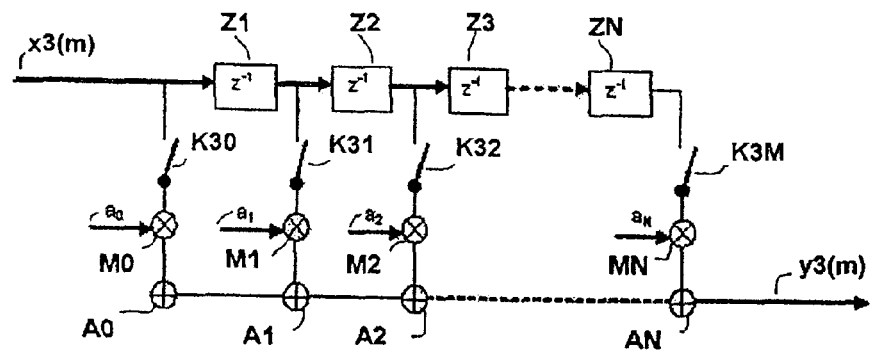
FIG. 6 illustrates diagrammatically a simplified digital data decimator circuit.

However, it is possible to reduce the calculation quantity by a factor M. FIG. 6 illustrates diagrammatically a decimator, denoted by $DEC^1$, enabling a simplified decimation operation to be carried out.

Its architecture is very similar to that of the decimator in FIG. 5. The input and output signals, with sampling frequencies Fsin and Fsout=Fsin/M, are referred to arbitrarily as x3(m) and y3(m) respectively.

The main difference consists in the fact that the output changeover switch K2 in FIG. 5 is replaced by a series if N+1 changeover switches K30 to K3N, arranged between the signal input x3(m) and the multiplier M0 on the one hand, and the outputs of operators Z1 to ZN, and the respective multipliers, M1 to MN on the other.

The data interpolation is used to estimate the value of a function between known data without knowing the function which effectively represents them. The interpolation methods may be distributed on the basis of two main categories:

Global interpolation:

These methods are based on the construction of a simple equation which adapts all the data points. This equation is normally a high degree polynomial equation.

Interpolation by segments:

These methods are based on the construction of lower degree polynomials between two or more known points. If a first degree polynomial is used it is called linear interpolation, and the interpolation corresponds to a straight line between two successive data points. For the higher polynomial orders (order 2 and up), different polynomials may be used.

In a preferred embodiment of the invention "B-Spline" type polynomials are used. For the second and third orders of "B-Splines", this method of interpolation is called quadratic and cubic respectively. The higher the degree of "B-Splines" the smoother the curve obtained. The "B-Splines" of a degree m have continuous derivatives up to degree m−1 at the data points.

The interpolation based on "B-Splines" is a useful method of obtaining an interpolation between known data points, considering its stability characteristics and minor variations.

In a preferred embodiment of the invention, as already recalled, an interpolation algorithm is applied using quadratic "B-Splines".

It is assumed that $N_a$ is a time between arbitrary times n and n+1, and if $y(N_a)$ represents the output sample interpolated at time $N_a$, it is also assumed that $x(N+1)$ and $x(n+2)$ represent input samples at n, n+1 and n+2 respectively.

It can be demonstrated that $y(N_a)$ obeys the following relation:

$$y(N_a) = h_0 * x(n) + h_1 * x(n+1) + h_2 * x(n+2) \quad (5)$$

where $$h_0 = (1/2)*(1-\alpha)^2$$

$$h_1 = (1/2)*(1+\alpha)^2 + (3/2)*\alpha^2$$

$$h_2 = (1/2)*\alpha^2$$

and:

$y(N_a)$ is the output sample at time $N_a$;

$x(n)$, $x(n+1)$, $x(n+2)$ are the input samples at times n, n++1 and n+2 respectively; and α is the standardised difference in time between $N_a$ and n (i.e. reduced to a number in the range [0; 1[).

Figure 7:
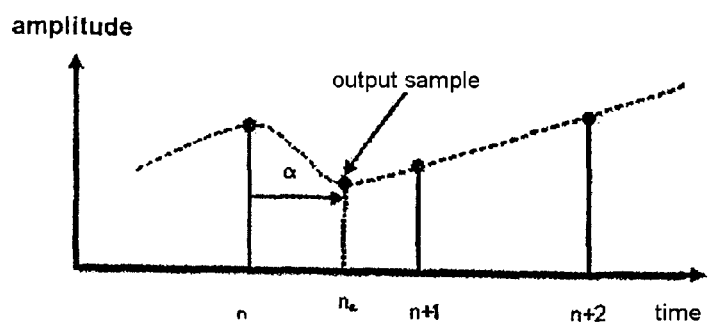
FIG. 7 is a graph illustrating diagrammatically the interpolation process, i.e. the fact that it is able to calculate the value of the signal at any point on the curve.

FIG. 7 illustrates diagrammatically the data interpolation process just described.

The vertical axis represents the amplitude of the signal, and the horizontal axis represents the time at the above-mentioned moments n, n+1, n+2 and $N_a$, together with the value α.

Generally speaking, the response in frequency of a "B-Spline" of the $n^{th}$ order, applied to a signal sampled at the frequency Lfs, is given by the relation:

$$F(f) = \frac{\sin^{N+1}\left(\frac{\pi f}{Lfs}\right)}{\left(\frac{\pi f}{Lfs}\right)^{N+1}} \quad (6)$$

It follows that the frequency response of a system that uses a quadratic "B-Spline interpolation at the critical frequency φ=(L−12)fs is given by the relation:

$$E = \frac{\sin^3\left(\frac{\pi\left(L-\frac{1}{2}\right)f}{Lfs}\right)}{\left(\frac{\pi\left(L-\frac{1}{2}\right)f}{Lfs}\right)^3} \quad (7)$$

hence $$E \approx \frac{1}{(2L)^3} \quad (7a)$$

a relation in which L is the total over-sampling factor.

For a given binary word length W and a quantification stage Q, the required over-sampling factor L is calculated as follows:

$$\frac{Q}{2} \geq \frac{1}{(2L)^3} \quad (8)$$

$$\frac{2^{-(w-1)}}{2} \geq \frac{1}{(2L)^3} \quad (8a)$$

$$L \geq 2^{\frac{w}{3}-1} \quad (8b)$$

Thus if words of 16 bits are used, the minimum over-sampling factor is $$L = 2^{\frac{16}{3}-1} = 2^5 = 32.$$

The over-sampling stages carried out before data interpolation typically result in a sampling frequency of at least 32×Fsin.

If words of 16 bits are used, the minimum over-sampling factor is $$L = 2^{\frac{24}{3}-1} = 2^7 = 32.$$

The over-sampling stages carried out before data interpolation typically result in a sampling frequency of at least 128×Fsin.

At this point it is interesting to note that for an accuracy of 16 bits, if a linear interpolation is carried out instead of a quadratic "B-Spline" interpolation, this would require an over-sampling factor equal to 128. For an accuracy of 24 bits, this over-sampling factor is increased to 2048, resulting in a very high number of filter coefficients to b stored, in a "ROM" memory, for example.

According to the above it is clearly established that the quadratic "B-Spline" interpolation allows a highly accurate interpolation to be carried out even with moderate sampling frequencies, which constitutes one of the advantages of the method of the invention. Over-sampling of ratio 128 is quite sufficient to ensure an accuracy of 24 bits in the base band [0; Fs/2].

The method according to the invention will now be described more specifically.

The first mode described will relate to the case of over-sampling. This case is particularly interesting because it will be demonstrated below that the case of under-sampling is derived directly from the over-sampling embodiment as it uses the same basic algorithm.

The input signal is sampled at the frequency Fsin and the output signal at the frequency Fsout.

In the over-sampling mode the output sampling frequency Fsout is higher than the input sampling frequency Fsin. Moreover, the complete content of the input signal in the "frequency range" is available in the output signal, and no band-pass limiting filter is required to avoid aliasing.

In a preferred embodiment the stages of the method are as follows:

Stage 1, called "2× over-sampling" (block 20): the input signal is over-sampled by a factor 2. This creates an internal signal (at the output of block 20) sampled at 2×Fsin with the upper part of the "empty" spectrum. The input signal only occupies the width of band 0 at Fsin/2).

Stage 2, called "64× over-sampling" (block 21): the output signal of block 20, and received by block 21, is again over-sampled by a factor of 64, which results in an internal signal (at the output of block 21) over-sampled at 128×Fsin and with an empty spectrum in the frequency band ranging from Fsin/2 to 64×Fsin=128×Fsin/2).

Stage 3, called "quadratic "B-Spline" interpolation" (block 22): a quadratic "B-Spline" interpolation is carried out during this final stage to generate an over-sampled output signal of frequency Fsout. Since Fsout is higher than Fsin, there is no risk of the formation of aliasing frequency components in the output frequency range (i.e. 0 to Fsout/2). The interpolation is carried out under the control of a signal representing the sampling frequency ratio Fsratio–Fsin/Fsout, which will be detailed below. This control parameter is transmitted to an input of block 22, which generates at the output the output signal at the sampling frequency Fsout.

Figure 9:
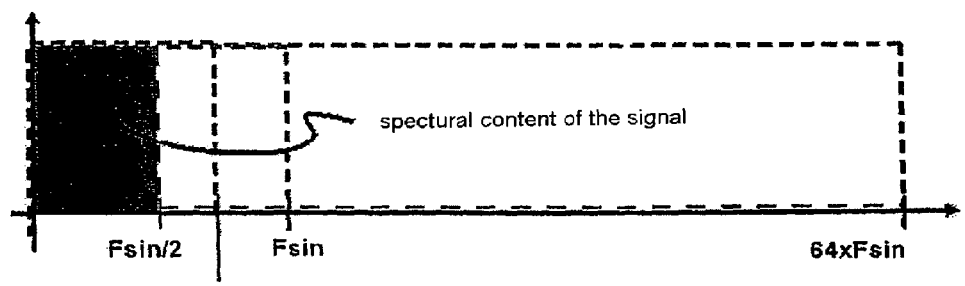
FIG. 9 is a graph illustrating diagrammatically the frequency range obtained in this over-sampling mode.

The graph in this FIG. 9 illustrates this process. The vertical axis represents amplitude A of the signal, and the horizontal axis is graduated in frequency. The frequencies Fsin/2, Fsout/2, Fsin and 64×Fsin are represented here. In the lower section of the spectrum, between 0 and Fsin/2, only the content of the frequency spectrum that is not empty has been represented in grey.

The first stage (block 20, which carries out the 2× over-sampling, is based on a "FIR" linear phase filter of the type previously described (see, for example, FIG. 2). It is useful to recall that since this is a linear phase filter, its coefficients are symmetrical. Because of this, only half of them require storage in a memory.

The characteristics of this filter are summarised in "TABLE I" at the end of this description.

The second stage (block 21), which carries out the 64× over-sampling, is also based on a "FIR" linear phase filter of the type previously described (see, for example, FIG. 2). It has the same advantages as those described above. Combined with the first stage, this stage increases the over-sampling ratio to 128×.

The characteristics of this filter are summarised in "TABLE II" at the end of this description.

At this stage of the description two remarks may be made:

The signal resulting from stages 1 and 2, in cascade (over-samplings 2× and 64×) must be characterised by an empty spectrum in the frequency range Fsin/2 to 64×Fsin. This is achieved in that the 64× over-sampling filter attenuates all the spectral foldbacks due to the zero padding process. In fact, when the input signal of this filter is a signal sampled at 2×Fsin, spectral foldbacks are introduced around multiples of the frequency 2×Fsin by the zero padding process. Moreover, the input signal of the 64× filter has an empty spectrum of Fsin/2 to Fsin. Moreover, the first spectral foldback (centred on 2×Fsin) takes place from 2×Fsin to Fsin, but does not have any significant spectral content in the band Fsin to 3×Fsin/2. Because of this it is sufficient for the 64× over-sampling filter to attenuate to a high degree all components above Fsin. The advantageous result of this is a considerable attenuation of the conditions imposed on the transition band of the over-sampling 64× filter and a reduction in the number of intermediate connections of the signal from the filter. Typically, if the 64× over-sampling filter must attenuate all the frequency components from Fsin to the high frequencies, the number of connections is practically doubled, result in larger tables, which must be stored in a memory, a "ROM" memory for example.

As will be detailed below, the calculation load for the 64× over-sampling stage may be considerably reduced by only calculating the samples that are required. IN fact, the interpolation stage following the second stage uses quadratic "B-Splines", which require three reference points for the interpolation. Therefore not all the output samples of the 64× over-sampling stage are required, and some may be omitted, which correspondingly reduces the calculation quantity required.

Stage 3, or the final stage, of the method according to the invention consists, as already indicated, in a quadratic "B-Spline" interpolation that allows an accurate interpolation from only three known data points, provided that these data points are sufficiently close to the interpolation point. It has been previously explained that an over-sampling ratio of 128, for input data, is sufficient to obtain an accuracy of 24 bits, which in practice is the highest resolution currently used in acoustics.

It will now be described in greater detail how the "B-Spline" interpolation stage is carried out.

The "B-Spline" interpolation stage is carried out using a parameter that we shall call Fsratio. This parameter is a sampling frequency ratio with Sfratio=Fsin/Fsout. To understand the process in this stage an abstract time line may be considered with a time origin arbitrarily denoted by 0, with a virtual time base such as the (virtual) interval of time between the appearance of two consecutive samples of the over-sampled 2× input samples is equal to the unit.

Figure 10:
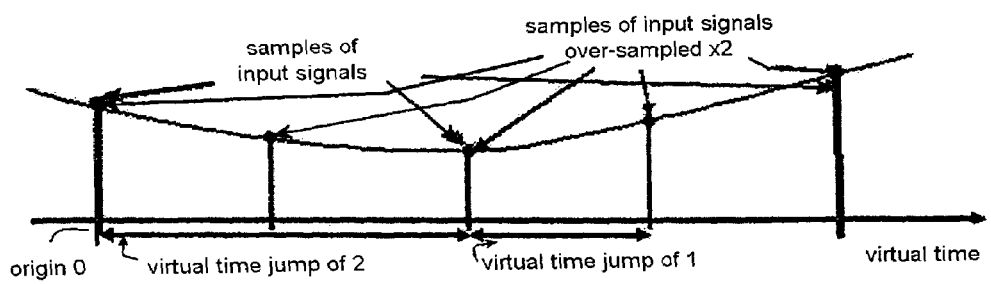
FIGS. 10 to 12 are graphs illustrating diagrammatically an interpolation stage that makes use of quadratic "B-Spline" functions in this over-sampling mode.

FIG. 10 illustrates this process. The horizontal axis is the above-mentioned virtual time axis, commencing arbitrarily at the virtual time origin 0. Three input signal samples and five over-sampled 2× input signal samples have been shown. Two consecutive intervals of time have also been shown: a virtual time jump of 2 (i.e. jump between two consecutive input samples) and a virtual time jump of 1 (i.e. a jump between two consecutive 2× input samples). A curve, whose function which describes it is not known a priori, has been shown passing through these samples.

The moments when an output sample would be produced can be expressed on this virtual time base. In fact, knowing the Fsin/Fsout ratio, and having positioned a virtual time origin (origin 0), it is then possible to calculate the instantaneous virtual time for which an output sample is required.

This is accomplished as follows: it is assumed that the data flows at the input and output are synchronous at the time origin (for example, an input sample is received at virtual time 0, and an output sample is generated at virtual time 0). It is always possible, since a pure abstract delay is used, to synchronise the virtual points of departure of the data flows. In the virtual time base descried above, the next output sample is generated at time $t1=2\times Fsin/Fsout$. The next output sample is then generated at time $t2=t1+2\times Fsin/Fsout$, then the next at $t3=t2+2\times Fsin/Fsout$ and so on.

Figure 11:
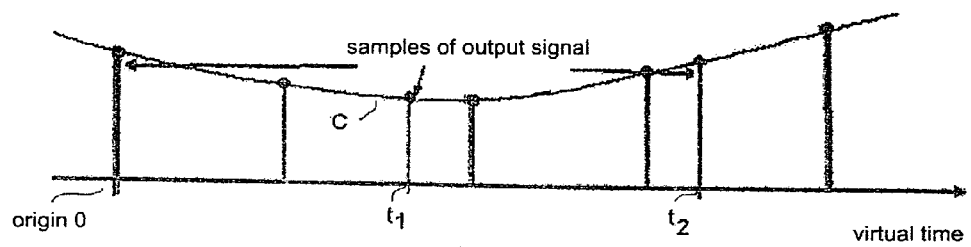
Figure 12:
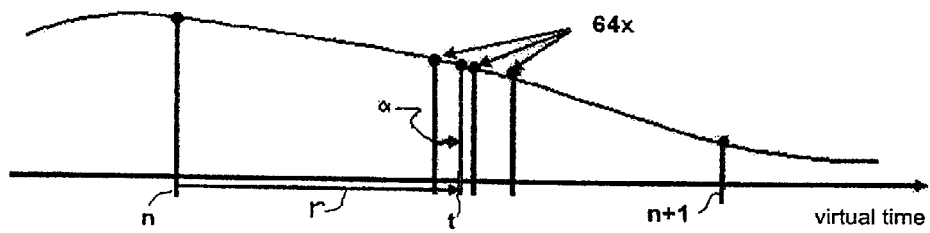

The diagram in FIG. 12, derived from FIG. 11, illustrates this process. More specifically the times t1 and t2 are shown by way of example.

Once the virtual moment of time of an output sample is known, the outputs of the 64× over-sampling stage it is necessary to know may be determined. In fact, knowing the output moment enables the phase of the 64× over-sampling stage that immediately preceding this moment to be determined that will be spaced apart by the sixty fourth of the virtual unit of time. Having fixed this phase it is necessary to calculate this given phase and the next two to obtain three data points from which the data interpolation is carried out using the quadratic "B-Splines".

The next FIG. 12 illustrates the choice of phases at the 64× over-sampling stage.

According to the virtual synchronisation conventions described above, r is defined so that $t=n+r$. r is therefore a number so that $0 \leq r < 1$, r representing the shift in virtual time between the output sample and the over-sampled 2× input signal sample that immediately precedes the output sample. Obtaining the correct over-sampled 2× input signal sample is quite simple: knowing the virtual time t of the output sample, it is sufficient to jump the over-sampled 2× input samples until $r=t-n$, 1. This process is normally imlemented by decremeting t by one unit to each new over-sampled 2× input signal sample.

The 64× over-sampling stage produces samples spaced apart by one sixty fourth of the virtual unit period of time, and hence the phase immediately preceding the virtual output time t is given by the $k^{th}$ phase of the filter, so that:

$$k \times (1/64) \leq r < (k+1) \times (1/64) \quad (9)$$

k is easily calculated by taking the full value (rounded to the lower value) of r×64, for example:

$$k=[r \times 64] \quad (9a)$$

a relation in which [ ] represents the entire lower rounded part.

The data points used to apply the quadratic "B-Spline" are therefore given by the phases k, k+1 and k+2 of the 64× over-sampling filtering it must be noted, however, that since k is between 0 and 63, k+1 and k+2 may actually exceed 63 and in this case, therefore, the over-sampled 2× input needs to be carried out in steps, and k+1 and k+2 reduced by 64 if necessary.

At this point there are three data points for calculating the "B-Spline". The value that is still missing is a parameter we shall call α, a parameter used in calculating the "B-Spline" coefficient. This parameter α is shown in FIG. 12.

To apply the quadratic "B-Spline" interpolation, α must be normalised in the interval [0; 1[. With the virtual time base α would vary within the interval in [0; 1/64[. Thus to obtain a normalised α parameter the following relation is used:

$$\alpha = r \times 64 - k = r \times 64 - [r \times 64] \quad (10)$$

A relation in which [ ] is defined as above (relation (9a)).

Once the parameter α has been normalised in [0; 1[, the quadratic "B-Spline" interpolation formulae (as defined above) may be applied to calculate the output sample.

It is very important to note that there is no a priori limitation in terms of the maximum possible frequency Fsout. Since the final stage is in continuous time (a "B-Splines" polynomial is obtained which may express the value of the signal at any moment in virtual time), the only maximum frequency limitation Fsout is associated only with the calculation capacity of the device implementing the method, i.e. it only depends n the possibilities provided by the technologies currently available.

The case of under-sampling will now be described. In this case the output sampling frequency Fsout is lower than the input sampling frequency Fsin. This means that there is a content of the frequency range of the input signal which the output signal cannot reproduce because of the sampling theorem. Thus it is necessary to introduce a filter which limits the bandwidth of the input signal to Fsout/2.

We shall first of all consider the particular case for which $Fsin/2 \leq Fsout < Fsin$ and then generalised to $Fsout < Fsin$.

It is also assumed that the low pass filter has the characteristics indicated in TABLE III at the end of this description. If this filter is now used as a 2× over-sampler, a signal sampled at 2×Fsin is obtained, the entire frequency content of which is removed, or at least very high attenuated, above Fsout/2, and hence above Fsin/2. The 64× over-sampling stage and the "B-Spline" interpolation stage may then be applied, as in the case of over-sampling, and the desired result obtained for the sampling frequency of Fsout. Since Fsout<Fsin and the filter introduced has reduced the input signal bandwidth to [0; Fsout/2[, the same algorithm may be applied as for the over-sampling stage.

In fact, what has been achieved is the modification of the first stage by passing from pure filtering in over-sampling (case of over-sampling described with reference to FIG. 8) to over-sampling with frequency band limitation. This filter, instead of transmitting the entire frequency content of the input signal, limits the bandwidth of the input signal to Fsout/2.

Figure 8:
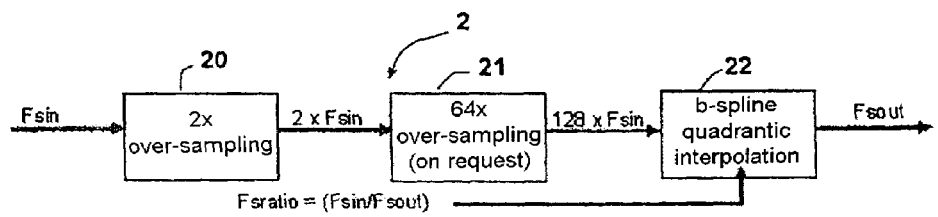
FIG. 8 illustrates, in the form of block diagrams, the main stages of the sampling frequency conversion method according to the invention applied to an over-sampling mode.

A block diagram corresponding to this case is, incidentally, quite similar to that in FIG. 8, with the single exception of the first stage (block 20) which, in addition to the 2× over-sampler, comprises the above-mentioned band limitation filter. It is not therefore necessary to represent it again.

In a preferred embodiment the stages of the method are as follows for the first under-sampling case:

Stage 1, called "2× over-sampling band limitation" (block 20 in modified FIG. 8): first of all, the input signal is over-sampled by a factor of 2 and band-pass limited to Fsout/2. This generates an internal signal sampled at 2×Fsin with a empty spectrum from Fsout/2 to the high frequencies (the limited band input signal only occupies bandwidth 0 to Fsout/2 instead of 0 to Fsin/2).

Stage 2, called "64× over-sampling" (identical to block 21 in FIG. 8): the signal is over-sampled by a factor of 64, resulting in an internal signal sampled at 128×Fsin and having an empty spectrum from Fsout/2 to 64×Fsin=128× Fsin/2.

Stage 3, called "quadratic B-Spline" interpolation" (identical to block 22 in FIG. 8): a quadratic "B-Spline" interpolation is carried out during this final stage to generate an over-sampled output signal of frequency Fsout. Since the spectral content has been reduced to Fsout/2 by the band limiting filter, there is no risk of the appearance of aliasing frequency components in the output frequency range (i.e. 0 to Fsout/2). The interpolation is carried out under the control of a signal representing the sampling frequency ratio Fsratio=Fsin/Fsout. As previously, this control parameter is transmitted to an input of a block (identical to block 22) which transmits the output signal at the output at the sampling frequency Fsout.

Figure 13:
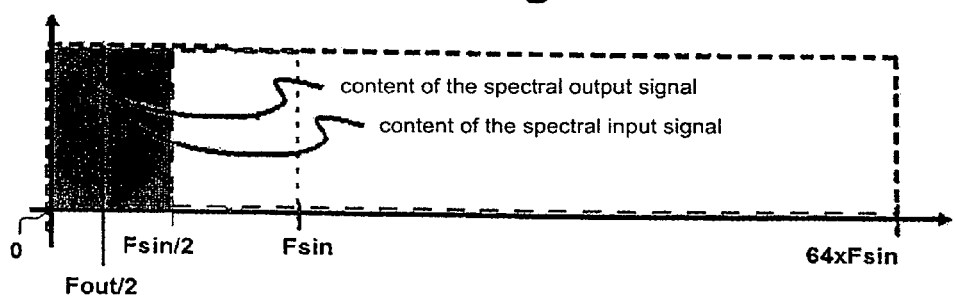
FIG. 13 is a graph illustrating diagrammatically the frequency range obtained in a first under-sampling mode.

The graph in FIG. 13 illustrates this process. The vertical axis represents amplitude A of the signal, and the horizontal axis is graduated in frequency. The frequencies Fout/2, Fsin/2, Fsin and 64× Fsin are shown. In the lower portions of the spectrum, between 0 and Fsout/2 on the one hand, and Fsout/2 and Fsin/2 on the other, the non-empty frequency spectral contents are shown in grey for the output and input signals respectively. Above Fsin/2 the spectrum is empty.

It is clear from the description above that a sampling frequency converter device according to the method of the invention, in the first under-sampling case, has an architecture that is strictly identical to that of the over-sampling case, except for the introduction of a suitable band limiting filter, which constitutes a very important characteristic of the invention and provides a certain advantage The generation of a band limiting filter according to the invention will now be described in greater detail.

According to an important characteristic, the band-pass limitation is separated, enabling the frequencies that could constitute phantom frequencies in the output frequency band to be separated from the interpolation, which enables one time base to be effectively transferred to another. This has several major advantages:

The adaptive time portion (interpolation) is very simple to carry out in this approach. In a preferred embodiment, only three filter coefficients are adaptive (for example the quadratic "B-Spline" coefficients), and need to be calculated in real time. This results in a low calculation volume.ès simple à réaliser dans cette approche.

The separation of the band-pass limiting and interpolation stages enables the band limiting coefficients of the deferred time filter to be calculated (and not, therefore, in the real time processing path), and therefore also results I a low volume of instantaneous calculations.

As detailed below, the method according to the invention does not require a special algorithm for calculating the band limiting coefficients of the filter. In fact, the algorithm used for the over-sampling case is also used to calculate the filter coefficients, thus obviating the use of a special filter coefficient calculation algorithm. This constitutes one of the principal characteristics.

The method of generating band limiting filter coefficients is based on a well known intrinsic property of the Fourier transform.

It is assumed that x represents a signal in the "time range", X is its representation in the "frequency range", and that FT, moreover, represents the Fourier transform operator. It is assumed that k is any non-negative real number other than zero, and that t and f represent time and frequency respectively. Because of the properties of the Fourier transform the following may be written:

$$FT(x(kt))(f)=X(f/k) \quad (11)$$

Consideration will now be given to the standard 2× over-sampling standard that has been used for the over-sampling case. In a preferred embodiment the filter has typical characteristics indicated in TABLE IV at the end of this description.

The situation where Fsin/2≦Fsout<Fsin is now considered. This implies that the following relation is verified : ½≦Fsout/Fsin<1. It is assumed that r=Fsout/Fsin<1. The signal h is then considered, and we apply the sampling frequency conversion with the ratio Fsratio=r. Since r<1, we are again in the over-sampling mode, and it again becomes possible to apply the stages previously described. We shall call the corresponding output signal $h_{out}$. $h_{out}$ therefore represents the signal h(n) re-sampled at the moments rn, for example $h_{out}(n)=h(rn)$. Thus the following is obtained in the frequency range:

$$FT(h_{out}(n))(f)=H_{out}(f)=H(f/r) \quad (12)$$

which means that the filter $h_{out}$ (n) has the characteristics indicated in TABLE V at the end of this description.

This approach therefore makes good use of the fundamental algorithm "SRC" to calculate the coefficients of the band limiting filter and does not therefore require any special or dedicated resources for this task, which as already indicated, constitutes a significant advantage.

The more general case of under-sampling will now be described, i.e. when the inequality Fsout<Fsin/2 is verified.

It will be shown that this case may easily be derived from the case previously described for which Fsin/2<Fsout<Fsin, provided that additional under-sampling stages are inserted.

When Fsout<Fsin/2, there is a single positive whole number other than zero M so that:

$$2^{-M}Fsin/2 \leq Fsout < 2^{-M}Fsin \quad (13)$$

In fact, this whole number M may easily be calculated using the following iterative algorithm:
Stage 1: initialisation of M=0;
Stage 2: M=M+1; and
Stage 3: if $2^{-M}Fsin/2 \leq Fsout$, then quite the iteration and proceed to stage 2.

It is then assumed that the input signal is forced to pass through M stages of the ×2 under-sampling circuit. In this case the resultant signal has a sampling frequency Fsin=$2^{-M}$Fsin. The following relation is therefore verified:

$$Fsin'/2 \leq Fsout < 2^{-M}Fsin' \quad (14)$$

This relation is quite similar to the case already considered for which Fsin/2≦Fsout<Fsin, Fsin being simply replaced by a sampling frequency signal Fsin'.

Therefore, in order to implement the case Fsout<Fsin/2, it is sufficient to execute the following stages:
Stage 1: initialisation to obtain M;
Stage 2: application of under-sampling by 2 (×2) M stages to obtain Fsin'=$2^{-M}$Fsin;
Stage 3: application of the stages in the previous case with Fsin'/2<Fsout<Fsin'; and
Stage 4: If there are still data to be converted to sampling frequency, return to stage 2.

A device for implementing the method of the invention for the case Fsout<Fsin/2 is therefore derived directly from the previous case (i.e. for which Fsin/2≦Fsout<Fsin). It is sufficient to precede the first block with a cascade of M stages of under-sampling by two (×2). It has also been indicated that the latter device was itself derived directly from the device (FIG. 8) for implementing the "over-sampling" case, for which Fsout>Fsin. Only the first stage (block 2) had to be slightly modified by including in it a band limiting filter at Fsout/2.

Figure 14:
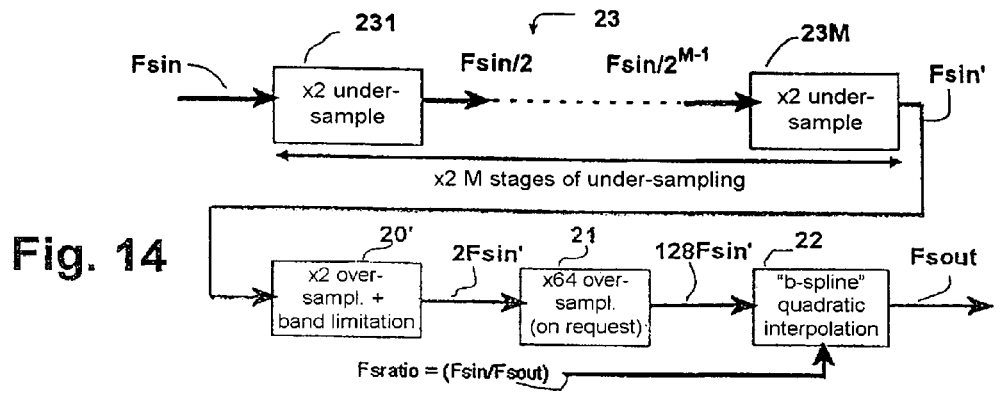
FIG. 14 illustrates, in the form of block diagrams, the main stages of the sampling frequency conversion method according to the invention applied to an under-sampling mode.

FIG. 14 illustrates diagrammatically, in the form of a block diagram, the architecture of a device implementing the method.

Blocks 21 and 22 are strictly identical, in their functions, to the blocks with the same references as in FIG. 8. Block 20' is similar to block 20, but incorporates a band limiting filter at Fsout/2, as previously stated. Finally, the input block, reference 23, includes a cascade of M identical stages, 231 to 23M, of under-sampling by two (×2). It receives the input signal Fsin transmits an output signal Fsin' to the input of block 20'. Each stage of block 23, 231 to 23M, transmits a ×2 under-sampling signal in relation to the signal received at its input: Fsin/2, . . . , Fsin/2$^{M-1}$, Fsin'=Fsin/2$^M$. It follows from this that block 209' transmits at its output a signal a signal 2Fsin', and block 21 a signal 128Fsin'. Block 22, for quadratic "B-Spline" interpolation, transmits the output signal Fsout under the control of the ratio parameter Fsratio= (Fsin/Fsout).

This architecture covers all possible cases of sampling frequency conversion.

The number of under-sampling stages is determined dynamically once Fsin and Fsout are known. IN fact, it is sufficient to know the ratio Fsratio=(Fsin/Fsout), or even the ratio Fsout/Fsin, which amounts to the same thing. Because of the architectural separation of the under-sampling, band limiting and interpolation processes, according to one of the important characteristics of the method of the invention, as indicated, there is no theoretical limitation regarding the possible sampling frequency conversion amplitude, even if Fsout <Fsin. It is sufficient merely to provide a suitable number M of under-sampling stages, and hence also of under-sampling stages for a device implementing the method.

In an execution of the method carried out by means of a software element, this may be obtained by allocating slots of a central memory of an automatic data processing system with a recorded program, for example of the so-called "RAM" type, to the under-sampling stages. The only limitations found in practice are due to the available capacity of the central processing unit and/or to the available quantity of data processing memory of the device. There is therefore no theoretical limitation regarding the possible Fsin/Fsout. Conversion ratio. This extremely important characteristic provides a decisive technical advantage over the methods of prior art.

In the light of the above it may be stated that the sampling frequency (rate) conversion method according to the invention may be broken down into four characteristics, as set out below:

1. A band-pass limiting filter at Fsout/2, arranged at the input and acting only when Fsin>Fsout.

2. An over-sampling filter increasing the sampling frequency of the input signal by a factor L to attain a sampling frequency equal to L×Fsin or L×Fsin' (according to the ratio that exists between Fsin and Fsout), so that the interpolation operation that follows does not give rise to any significant distortion.

3. An interpolation stage receiving at the input the output signal of the above-mentioned over-sampling filter and directly generating the output signal sampled at the frequency Fsout.

4. A configuration stage of the band-pass limiting filter arranged at the input so that:

4.1. if *Fsin>Fsout≧Fsin*/2:

(a) a given <<FIR>> filter prototype is used, characterised by its impulse response;

(b) the sampling frequency conversion algorithm proper is used for re-sampling this impulse response, according to a sampling frequency ratio of Fsratio=Fsin/Fsout, higher than the unit, for obtaining the coefficients of a new "FIR" filter whose frequency characteristics are identical to those of the prototype, according to a ratio homethetic to Fsout/Fsin;

(c) this new "FIR" filter is used as a band-pass limiting filter at Fsout/2.

4.2. If Fsin/2>Fsout:

(a) the single whole number k is determined so that Fsin/2$^k$>Fsout≧Fsin/(2$^{(k+1)}$);

(b) an under-sampling filter is configured and activated by a factor $_2{}^k$ at the input of the "SRC" device;

(c) a band-pass limiting filter is configured in a manner identical to that in point 4.1 above, except that this limitation is applied to an input signal sampled at the frequency Fsin'=Fsin/2$^k$ (i.e. at the output of the under-sampling filter);

(d) the band-pass limiting filter is in this case a combination of the under-sampling filter and the band-pass limiting filter. The output frequency of this filter, is denoted by Fsin', i.e. Fsin/2$^k$.

4.3. If Fsin≦Fsout, the band-pass limiting filter is limited to the "FIR" filter prototype used in point 4.2.

It may be noted, in particular, that the adaptive part of the band-pass limiting filter must only allow a reduced range of variation. In fat, according to an important characteristic of the invention, it is always possible to resort to the case for which Fsin>Fsout>Fsin/2. Therefore the filter must only be adaptable at cut-off frequency in the range [Fsin/4; Fsin/2]. The division by two factor is the consequence of Shannon's theorem. The value Fsin/2$^k$ is denoted by Fsin' if Fsin/2>Fsout, and Fsin'=Fsin in all other cases.

Figure 15:
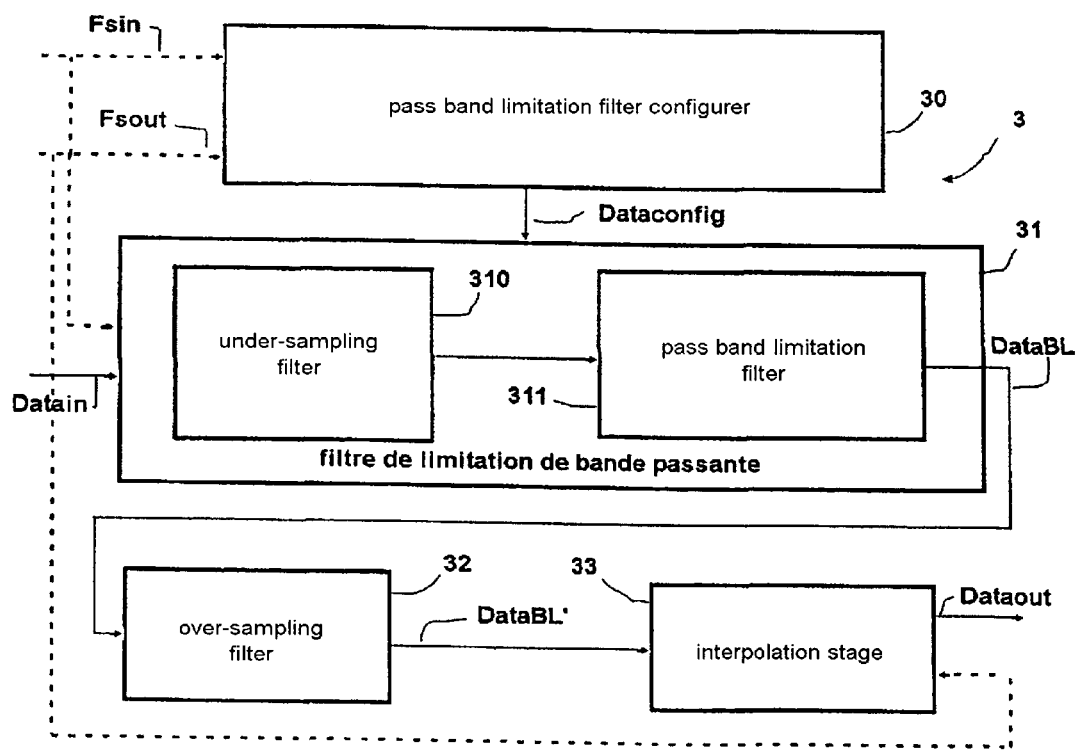
FIG. 15 is a diagrammatic illustration, in the form of a block diagram, of the stages of the sampling frequency conversion method according to the invention, covering the under- and over-sampling modes.

The essential characteristics of the method according to the invention that have just been described may be represented diagrammatically by the block diagram in FIG. 15, under the general reference 3.

Block 30 illustrates the band-pass filter configuration stage. The filter receives at its input the values of the input and output sampling frequencies, Fsin et Fsout respectively. It is determined whether Fsin≦Fsout (see point 4.3.), Fsin>Fsout≧Fsin/2 (see point 4.1.) or whether Fsin/2<Fsout (see point 4.3.). The under-sampling filter is configured and coefficients of the pas band limiting filter are calculated accordingly. At the output a parameter, reference Dataconfig in FIG. 15, is obtained enabling the under-sampling filter to be configured and the coefficients of the band-pass limiting filter to be calculated.

This Dataconfig parameter is transmitted to a block 31, consisting of the band-pass limiting filter. Block 31 also receives at two additional inputs the value of the sampling frequency Fsin and input data Datain, sampled at this frequency. Block 31 includes an under-sampling filter 310 and the band-pass limiting filter proper, 311 (optional stage according to the case considered).

The output signal DataBL, generated by block 31, more precisely block 311, consists of the input data limited in the band-pass at the sampling .2.).

The band-pass limiting filter 310 is dynamically configured. It is actuated if, and only if, Fsout>Fsin/2. (see point 4.1.).

The output signal DataBL, generated by block 31, more precisely by block 311, consists of the input data limited in the band-pass at the sampling frequency Fsin' (as defined above).

The signal dataBL is transmitted to an over-sampling filter 32 by a factor L.

The signal DataBL' generated at the output by this filter 32 is a signal limited in the band-pass of sampling frequency L×Fsin'. This signal DataBL' is transmitted to the input of interpolation stage 33.

Interpolation stage 33 is arranged so that it does not introduce distortion and produces a signal sampled at the frequency Fsout.

The method according to the invention that has just been described may be implemented by means of a software part interacting with calculation and data storage circuits, fixed memory (e.g. of the aforementioned "ROM" type), and/or random access volatile memory (of the aforementioned "RAM" type), particularly for storing filter coefficients. The method may also be implemented using specific logical circuits associated with memory circuits, an automatic data processing system with a recorded program: standard microcomputer or processor specialising in the processing of digital signals, e.g. of the type known under the English name "DSP"(standing for "Digital Signal Processor", associated with means of storage.

Figure 16:
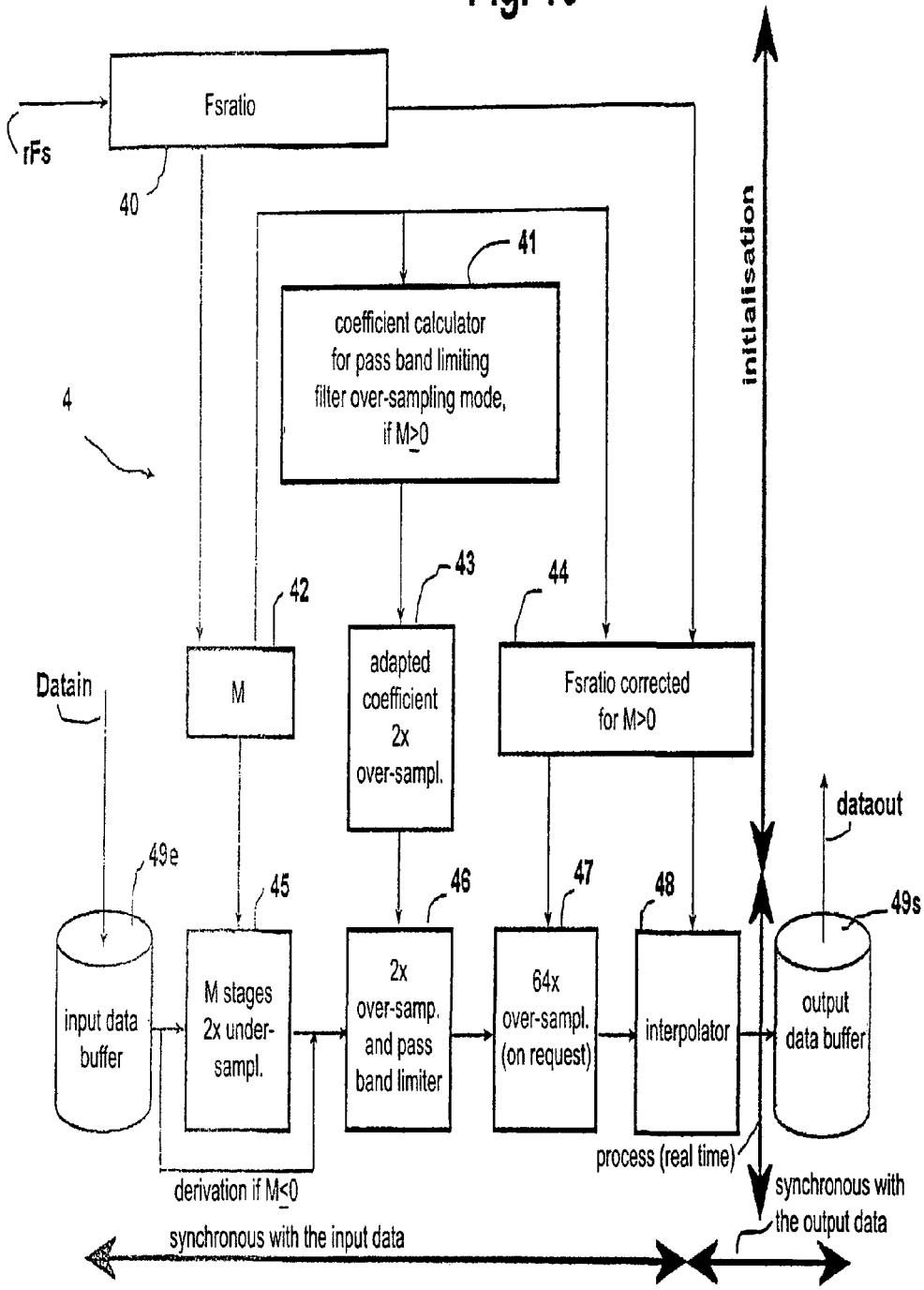
FIG. 16 illustrates diagrammatically an example of architecture of a device implementing the sampling frequency conversion method according to a preferred embodiment of the invention.

FIG. 16 illustrates diagrammatically an example of the architecture of a device implementing the sampling frequency (rate) conversion method according to a preferred embodiment of the invention, under general reference 4.

The modules of circuits shown in the upper part of FIG. 16 relate to the initialisation stages of the method. A first module 40 receives a parameter rFs enabling the desired ratio Fsratio between the sampling frequencies of the input and output signals to be calculated.

This ratio Fsratio is transmitted to a module 42, resulting in the generation of the factor M previously defined and to a module 44 for correcting the ratio Fsratio if the inequality M>o is verified.

Factor M is transmitted to the input of two modules: a module 41 for calculating the coefficients of the band-pass limiting filter, and module 44 for correcting the aforementioned ratio Fsratio The band-pass limitation is only effective if M≧0.

The signal at the output of module 41 is transmitted to a module 43 for adapting the 2× over-sampling coefficients, the calculations being carried out in all cases.

The modules of circuits shown in the lower part of FIG. 16 correspond to the stages carried out in real time of the method according to the invention. Moreover, in the left part, as far as interpolator module 48, the process is synchronous with the input data, referenced Datain. From this module 48 the process is synchronous with the output data, referenced Dataout.

The input data, Datain, at the sampling frequency Fsin, are transmitted to the input of a first buffer memory 49e and stored in this memory. This may, for example, be a memory of the so-called "FIFO" type (standing for "First In First out"). The output of this buffer $49^e$ is transmitted, in synchronism with the input data flow Datain, to the input of a module comprising M under-sampling stages, M being the parameter calculated by module 42. As has been indicated, this operation is only carried out if M≦0. Otherwise provision is made for a derivation or "bypass", according to the English terminology in current use. The data are then transmitted directly to a module arranged in cascade with module 45. To do this module 45 comprises control means (not shown) that react to the value of M for switching the incoming data to the under-sampling stages or to the "bypass".

Module 45 carries out the 2× over-sampling and band-pass limiting operations. Again, as indicated, the latter operation is only carried out in the "under-sampling" modes.

The signal at the output is transmitted to a 64× over-sampling module 47, which receives at a control input the corrected ratio Fsratio if M>0 of module 44. The output of module 47 is transmitted to data interpolation module 48. The output of module 47 is transmitted to data interpolation module 48. As has been indicated, in a preferred embodiment this interpolation is based on quadratic "B-Splines".

Finally, the data at the output of module 48 are stored in an output buffer memory 49s, which may be of the same type as the input buffer memory 49e. The latter transmits the output data Dataout at the sampling frequency Fsout, as a function of the desired Fsratio.

The preferred applications of the method of the invention relate first of all to the sampling rate conversion proper, or "SRC", and even more specifically to the "SRC's" used in the audio field.

A classic application of an "SRC" in this field is that of converting audio-digital data of a given sampling frequency to audio data of the same kind, but sampled at a different sampling frequency In the audio-digital field a large number of sampling frequencies are used, particularly the following: 8, 11,025, 12, 16, 22,05, 24, 32, 44.1, 48, (64), 88,2, 96, (128), 176,4, 192, (352,8 and 384) kHz, the frequencies indicated in brackets being rarely used, whilst the others are frequently used, even used almost as standard.

In order to transfer data from one audio-digital system to another it is often necessary to adapt the sampling frequency of the data because one or other of the audio-digital systems is incompatible with the sampling frequencies of other systems to which it is connected. Consequently, establishing a connection between two incompatible systems often requires the use of an "SRC" at the interface.

A typical application of the "SRC's" may be found in the automotive industry for multimedia onboard systems. Modern care architectures often incorporate a multimedia transfer bus (e.g. a bus of the so-called <<MOST>> type) operating at a fixed sampling rate, e.g. at 48 kHz, for transmitting audio-digital data to the rear speakers of the car. However, there are other audio sources in the car, services that use signals whose sampling frequency is different from 48 kHz, such as a CD reader with a sampling frequency of 44.1 kHz, or a so-called "hands free" device for a mobile telephone connection to the "GSM" standard, operating at 8 kHz. Thus in order to transmit the audio-digital data to the incorporated multimedia bus, it is necessary to carry out a sampling frequency conversion. More generally there are n sources of signals sampled at frequencies $F_1, \ldots, F_x, \ldots, F_n$ kHz, with $F_x$ corresponding to one or other of the values indicated above. It will therefore be necessary to have x "SRC's", with a conversion ratio $Rx=(F_x/48)$, Fx being expressed in kHz. As has been shown, Rx may assume any values, whether in the over- or under-sampling mode. The only limitations are those due to the technologies actually used.

The method according to the invention is not, however, limited to the sampling frequency conversion proper. It may be put to advantage in numerous other fields.

By way of non-exhaustive example it may be used to eliminate jitter, particularly in a digital-analogue converter.

It is known that jitter is one of the main factors of quality degradation in audio-digital sound reproduction or recording systems. Jitter is characterised by an undesirable variation in the clock cycle around a central value of that cycle. It may be considered to be a noise signal present on the audio clock.

These systems incorporate a digital-analogue converter. To obtain a good quality digital-analogue conversion it is essential to eliminate this parasitic jitter effect as far as possible.

The general architecture of such a system normally includes an audio-digital receiving input, which extracts the digital signals and clock signals from the incoming data flow and separates them into two distinct paths. This stage is based on an oscillator of the "PLL" type (standing for Phase Locked-Loop"). Experience shows that transmission is of poor quality, even if the <<PLL>> carries out phasing on the incoming data flow. There is generally undesirable residual jitter which impairs the quality of the audio-digital signal.

The output stage carries out the digital-analogue conversion proper.

To avid this problem, use is made of a very accurate local clock instead of relying on a low jitter signal, it being understood that it is much easier to obtain a low fitter on a local clock. An "SCR" is inserted between the two stages. The latter carries out a sampling frequency conversion between the frequency of the input signals and that imposed by the accurate local clock. As in the case of FIG. 16, the input circuits as far as the "SRC" are synchronous with the sampling frequency of the input data. From the "SRC" the output circuits are synchronous with the sampling frequency of the output data (determined by the internal clock).

Incidentally, an additional advantage achieved by the use of an "SRC" lies in the fact that the analogue output stage of the digital-analogue converter only needs to be optimised for a single sampling frequency, which is easy to obtain. Quite the contrary, in a device without "SRC" the analogue output stage is based on compromises because it must be agreed for multiple sampling frequencies.

On reading the above it is easily understood that the invention achieves its established aims by a wide margin.

In fact, the method according to the invention provides numerous advantages that have been previously summarised. It is not necessary to list them all again, but the main advantages may be mentioned here, namely:

it has a low level of complexity and high performance;
it allows potentially unlimited conversion ratios between the input and output sampling frequencies;
it uses the same, algorithm to carry out the sampling frequency conversion and derive the band-pass limiting filter coefficients; and
it requires only low storage capacity because the number of filter coefficients is low.

It must be clear, however, that the invention is not limited merely to the exemplary embodiments explicitly described, particularly in relation to FIGS. 8 to 16.

The numerical values and the examples of circuits that can be used to perform the functions required by the method (filtering, over- and under-sampling, interpolation, etc.) have been given merely to illustrate more clearly the main characteristics of the invention and result solely from a technological choice within the scope of knowledge of the person skilled in the art. It has been indicated that most of these functions were of prior art, the innovating characteristics of the invention and the technical advantages obtained residing in their specific arrangement. This situation also represents an additional advantage, because it is possible to apply technologies of prior art without any major modification.

The invention is not limited either to the applications explicitly described. Besides the main application relating to sampling rate conversion proper, as has been indicated, it may also be used to advantage in numerous other fields.

TABLE I

| type of filter | 2 × over-sampling |
|---|---|
| Sampling frequency | 2 |
| Upper band-pass frequency | 0.454 |
| Lower band cut-off frequency | 0.546 |
| Band-pass ripple (in dB) | 0.001 |
| Band cut-off attenuation (dB) | 150 |
| Number of intermediate connections | 156 |
| Polyphase N | 78 |

TABLE II

| Type of filter | 64 × over-sampling |
|---|---|
| Sampling frequency | 128 |
| Upper band-pass frequency | 0.5 |
| Lower band cut-off frequency | 1.45 |
| Band-pass ripple (in dB) | 0.001 |
| Band cut-off attenuation(in dB) | 150 |
| Number of intermediate connections | 1024 |
| Polyphase N | 16 |

TABLE III

| type of filter | low pass for Fsin/2 |
|---|---|
| Sampling frequency | 2 |
| Upper band-pass frequency | 0.454 × Fsout/Fsin |
| Lower band cut-off frequency | 0.546 × Fsout/Fsin |

TABLE IV

| type of filter | 2 × over-sampling 2 × (h(n)) |
|---|---|
| Sampling frequency | 2 |
| Upper band-pass frequency | 0.454 |
| Lower band cut-off frequency | 0.546 |

TABLE V

| type of filter | 2 × over-sampling and band limitation (h(n)) |
|---|---|
| Sampling frequency | 2 |
| Upper band-pass frequency | 0.454 × r = 0.454 × Fsout/Fsin |
| Lower band cut-off frequency | 0.546 × r = 0.546 × Fsout/Fsin |

The invention claimed is:

1. A method of converting sampling frequency according to a predetermined ratio comprising a first initialisation stage consisting in acquiring a first sampling frequency, called Fsin, associated with a first digital signal, called an input signal, and in selecting a second sampling frequency, called Fsout, called an output signal, wherein the ratio between the said first and second sampling frequencies constitute the said predetermined ratio, said method comprising an initialisation phase that includes:

a first initialisation stage consisting in determining a single whole number k, so that the relation:

$$(Fsin/Fsout)/2^k > 1 \geq (Fsin/Fsout)/(2^{(k+1)})$$

is satisfied, and in recording the said number in storage means;

a second initialisation stage consisting, if k>0, in configuring a digital filter for under-sampling the said input signal by a factor $2^k$, and in recording the parameters associated with this configuration in storage means;

a third initialisation stage consisting in configuring a digital band-pass limiting filter with a cut-off frequency Fsout/2 and in determining its coefficients if, and only if one of the following relations is satisfied: Fsin≦Fsout, Fsin>Fsout≧Fsin/2 or Fsin/2<Fsout, and in recording the said coefficients in storage means;

and a process phase carried out in real time, comprising:

a first process stage consisting, if and only if k>0, in applying the said digital under-sampling filter by a factor $2^k$ to the said input signal so as to generate an intermediate signal;

a second process stage consisting, if and only if k≧0, in applying the said digital band-pass limiting filter to the said first intermediate signal, and in short-circuiting this filter if k<0, so as to generate a second intermediate signal;

a third process stage consisting in over-sampling the said second intermediate signal by a predetermined factor L; and a fourth process stage consisting in applying to the said third signal a stage for interpolating digital data so as to generate the said output signal at the sampling frequency Fsout.

2. The method according to claim 1, wherein said digital band-pass limiting filter is a filter of the so-called finite impulse response type.

3. The method according to claim 2, wherein said third initialisation stage, consisting in configuring the said digital band-pass limiting filter, comprises the following sub-stages:

choice of a finite impulse response filter prototype, characterised by a predetermined impulse response;

realisation of the said stages of the sampling rate conversion method for re-sampling the said impulse response according to the said predetermined ratio Fsin/Fsout, in order to obtain the coefficients of a modified finite impulse response filter whose frequency characteristics are identical to those of the said prototype, in a ratio homothetic to the predetermined ratio Fsin/Fsout;

recording of the said coefficients in storage means; and use of the said modified finite impulse response filter as a band-pass limiting filter at the frequency Fsout/2.

4. The method according to claim 1, wherein said fourth process stage uses a polynomial digital data interpolation by segments of the so-called "B-Splines" type of a predetermined order.

5. The method according to claim 4, wherein said "B-Splines" are quadratic.

6. The method according to claim 1, wherein said third process stage comprises:

a first sub-stage consisting in over-sampling the said second intermediate signal by a factor of two; and a second sub-stage consisting in over-sampling the signal thus obtained by a factor of sixty four, in order to obtain the said intermediate signal sampled at twenty eight times the sampling frequency of the said second intermediate signal.

7. The method according to claim 1, realised in the form of a software element interacting with the calculation and storage means of an automatic data processing system with a recorded program.

8. The method according to claim 7, wherein said automatic data processing system with recorded program is a microcomputer.

9. The method according to claim 7, wherein the automatic data processing system with recorded program is a processor specialising in the processing of digital signals comprising storage means.

10. A device for implementing the method according to claim 1, comprising:

a first series of so-called initialisation modules for carrying out the said initialisation stages, and comprising:

a first initialisation module (40) receiving at the input data for generating at the output the said determined conversion ratio;

a second initialisation module (41) receiving this over-sampling factor and, according to its value, calculating the coefficients of the said band-pass limiting filter and generating them at its output;

a third initialisation module (41) receiving this over-sampling factor and, according to its value, calculating the coefficients of the said band-pass limiting filter and generating them at its output;

a fourth initialisation module (44) receiving the said predetermined over-sampling factor and, according to its value, selectively correcting the said predetermined conversion ratio and generating it at its output; and a fifth initialisation module (43) receiving the coefficients of the said band-pass filter calculated by the said third module, and selectively calculating the adapted over-sampling coefficients and generating them at its output;

and a second series of so-called process modules for carrying out the stages in real time, comprising:

a first process module (45), receiving at a first input so-called input digital data at the said first sampling frequency Fsin and, at a second input, the output of the said second initialisation module (42), comprising the said factor $2^k$ under-sampling filter, a method of short-circuiting it, and control means for selectively transferring the said input data through the said factor $2^k$ under-sampling filter or the said bypass, depending on the output status of the said second initialisation module (42);

a second process module (46) receiving, at a first input, the output of the said first process module (45) and, at a second input, the output of the said fifth initialisation module (43) and carrying out a first factor two over-sampling on the data received at its first input, and selective band-pass filtering, according to the output status of the said fifth initialisation module (43);

a third process module (47) receiving, at a first input, the output of the said second process module (45) and, at a second input, the output of the said fourth initialisation module (44) and carrying out selectively, according to the output status of this fourth module (45), a first sixty four factor over-sampling on the data received at its first input; and a fourth process module (48) receiving at its input the output of the said third process module (47), carrying out on the data received at its inputs, the said interpolation of digital data and transmitting, at the output, data at the said second sampling frequency Fsout.

11. The device according to claim 10, comprising also first storage means forming a buffer ($49^e$), receiving so-called input data (Datain) at the said first sampling frequency Fsin and transmitting them to the said process module (45), in synchronism with the said input data (Datain), and of the second storage means forming a buffer ($49s$), receiving the output data of the said fourth process module and transmitting them in the form of so-called output data (Dataout), in synchronism with the data received at the input, at the said second sampling frequency Fsout.

* * * * *